(12) United States Patent
Kim

(10) Patent No.: US 10,311,923 B2
(45) Date of Patent: Jun. 4, 2019

(54) INPUT CIRCUIT OF THREE-DIMENSIONAL SEMICONDUCTOR APPARATUS CAPABLE OF ENABLING TESTING AND DIRECT ACCESS

(71) Applicant: SK hynix Inc., Icheon-si Gyeonggi-do (KR)

(72) Inventor: Dae Suk Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/416,130

(22) Filed: Jan. 26, 2017

(65) Prior Publication Data

US 2017/0133067 A1 May 11, 2017

Related U.S. Application Data

(62) Division of application No. 14/634,167, filed on Feb. 27, 2015, now Pat. No. 9,589,670.

(30) Foreign Application Priority Data

Dec. 5, 2014 (KR) .......................... 10-2014-0174416

(51) Int. Cl.
*G11C 7/10* (2006.01)
*G11C 7/22* (2006.01)
(Continued)

(52) U.S. Cl.
CPC .............. *G11C 7/22* (2013.01); *G11C 7/1078* (2013.01); *G11C 29/1201* (2013.01); *H03K 5/22* (2013.01);
(Continued)

(58) Field of Classification Search
CPC ...... G11C 7/1078; G11C 7/22; G11C 29/1201; G11C 5/04; G11C 7/1084; H03K 5/22
See application file for complete search history.

(56) References Cited

U.S. PATENT DOCUMENTS 4,970,454 A * 11/1990 Stambaugh ........ G01R 31/2884
324/73.1
5,005,173 A * 4/1991 Martin ........... G01R 31/318572
714/27
(Continued)

FOREIGN PATENT DOCUMENTS

KR 100394575 B1 7/2003
KR 20130072856 A * 7/2013

OTHER PUBLICATIONS

Attached Translation of KR20130072856A, Kim Ki Tae, Jul. 2, 2013.*

*Primary Examiner* — Mushfique Siddique
(74) *Attorney, Agent, or Firm* — William Park & Associates Ltd.

(57) ABSTRACT

An input circuit of a semiconductor apparatus may include a first input buffer configured to receive a signal through a test input terminal and to output a first input signal, a second input buffer configured to receive a signal through a normal input terminal and to output a second input signal. The input circuit of the semiconductor apparatus may include a switching unit configured to transfer the signal inputted through the test input terminal to the second input buffer according to a test mode signal. The input circuit of the semiconductor apparatus may include a comparison unit configured to compare the first input signal with the second input signal and to generate a comparison signal, and a storage unit configured to store the comparison signal.

6 Claims, 5 Drawing Sheets

(51) Int. Cl.
*G11C 29/12* (2006.01)
*H03K 5/22* (2006.01)
*G11C 5/04* (2006.01)

(52) U.S. Cl.
CPC .............. *G11C 5/04* (2013.01); *G11C 7/1084* (2013.01); *H01L 2224/16145* (2013.01); *H01L 2924/15192* (2013.01); *H01L 2924/15311* (2013.01)

(56) References Cited

U.S. PATENT DOCUMENTS

| | | | |
|---|---|---|---|
| 5,859,442 A * | 1/1999 | Manning | G01R 31/31905 257/203 |
| 7,123,497 B2 | 10/2006 | Matsui et al. | |
| 7,466,577 B2 | 12/2008 | Sekiguchi et al. | |
| 8,018,038 B2 * | 9/2011 | Nishizawa | G06K 19/07 235/492 |
| 8,031,505 B2 | 10/2011 | Kang et al. | |
| 9,123,399 B2 | 9/2015 | Yoko | |
| 9,343,438 B1 | 5/2016 | Lee | |
| 9,792,964 B1 * | 10/2017 | Okuma | G11C 7/1084 |
| 2004/0100296 A1 * | 5/2004 | Ong | G01R 31/2884 324/750.3 |
| 2007/0245200 A1 * | 10/2007 | Hattori | G11C 29/028 714/742 |
| 2009/0167337 A1 * | 7/2009 | Yamane | G11C 29/1201 324/750.3 |
| 2009/0268626 A1 * | 10/2009 | Nakamura | G11C 29/1201 370/252 |
| 2015/0235715 A1 * | 8/2015 | Cho | G11C 29/12 714/719 |
| 2016/0012864 A1 | 1/2016 | Park et al. | |

* cited by examiner

INPUT CIRCUIT OF THREE-DIMENSIONAL SEMICONDUCTOR APPARATUS CAPABLE OF ENABLING TESTING AND DIRECT ACCESS

CROSS-REFERENCES TO RELATED APPLICATION

The present application is a divisional application of U.S. application Ser. No. 14/634,167, filed on Feb. 27, 2015, and claims priority under 35 U.S.C. § 119 (a) to Korean application number 10-2014-0174416, filed on Dec. 5, 2014, in the Korean Intellectual Property Office, which is incorporated herein by reference in its entirety as set forth in full.

BACKGROUND

1. Technical Field

Various embodiments generally relate to a semiconductor apparatus, and more particularly, to an input circuit of a semiconductor apparatus and a semiconductor system using the same.

2. Related Art

A semiconductor memory may have a three-dimensional structure. The three-dimensional structure may include a plurality of memory dies that are stacked. Stacking the memory dies may be used as one method for improving an integration degree of a semiconductor memory.

Recently, a system on chip (SOC) type of semiconductor apparatus is being used. The SOC type of semiconductor apparatus uses a semiconductor memory module and a memory controller such as, for example, a CPU or a GPU. The semiconductor memory module and a memory controller of a SOC type semiconductor apparatus are fabricated into one package.

A SOC type of semiconductor apparatus may include a plurality of bumps for inputting and outputting data.

Because the pluralities of bumps are not exposed to an exterior of a package, a separate configuration may be required in order to directly access a semiconductor memory module.

SUMMARY

In an embodiment, an input circuit of a semiconductor apparatus may include a first input buffer configured to receive a signal through a test input terminal and to output a first input signal. The input circuit of a semiconductor apparatus may include a second input buffer configured to receive a signal through a normal input terminal and to output a second input signal. The input circuit of a semiconductor apparatus may include a switching unit configured to transfer the signal inputted through the test input terminal to the second input buffer according to a test mode signal. The input circuit of a semiconductor apparatus may include a comparison unit configured to compare the first input signal with the second input signal and to generate a comparison signal, and a storage unit configured to store the comparison signal.

In an embodiment, a semiconductor system may include a package substrate configured with a plurality of test input terminals are positioned below the package substrate, and an interposer coupled to an upper portion of the package substrate. The semiconductor system may include a memory module coupled to an upper portion of the interposer and including a plurality of normal input terminals. The semiconductor system may include a memory controller located on the interposer and coupled to the memory module. The memory module may be configured to test whether an input circuit coupled to the plurality of normal input terminals normally operates according to a signal inputted through the test input terminal.

In an embodiment, an input circuit of a semiconductor apparatus may include a first input buffer configured to receive a signal through a test input terminal and to output a first input signal. The input circuit of the semiconductor apparatus may include a second input buffer configured to receive a signal through a normal input terminal and to output a second input signal. The input circuit of the semiconductor apparatus may include a direct access mode circuit configured to perform an operation related to a direct access mode according to the first input signal. The input circuit of the semiconductor apparatus may include a normal mode circuit configured to perform an operation including data write or read related to a normal mode according to the second input signal.

DETAILED DESCRIPTION

Hereinafter, an input circuit of a semiconductor apparatus and a semiconductor system using the same according to various embodiments will be described with reference to the accompanying drawings through examples of various embodiments.

An input circuit of a semiconductor apparatus configured for enabling direct access and an input test and a semiconductor system using the same may be described herein.

Figure 1:
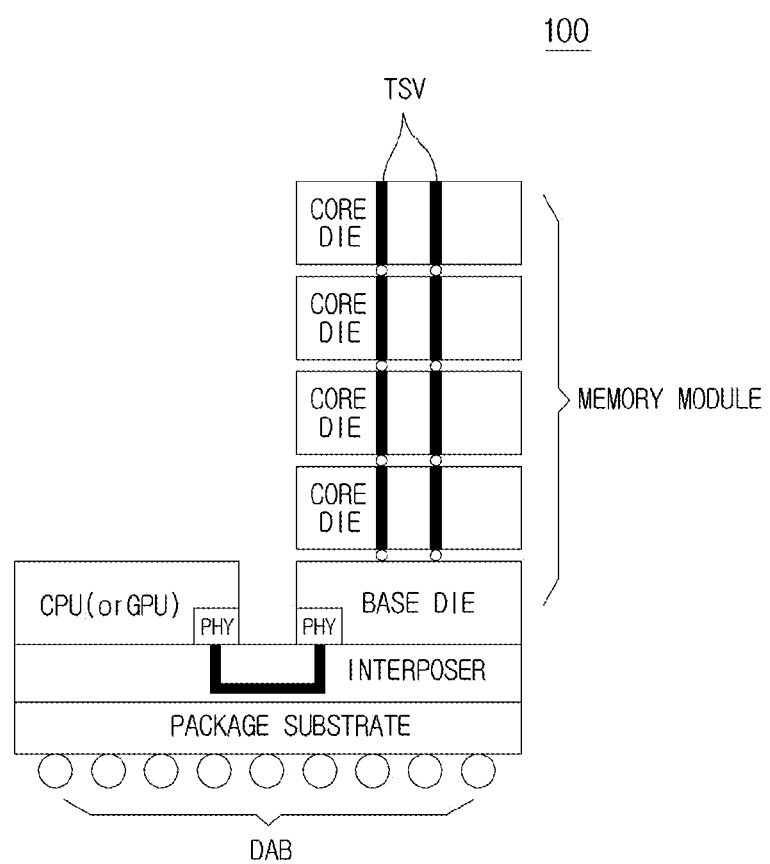
FIG. 1 is a diagram illustrating an example of a representation of a configuration of a semiconductor system 100 according to an embodiment.

Referring to FIG. 1, a semiconductor system 100 according to an embodiment may have a system on chip (SOC) structure.

The semiconductor system 100 according to an embodiment may include a memory module, a memory controller (a CPU or a GPU), an interposer, a package substrate, and a plurality of test input terminals.

For the plurality of test input terminals, direct access balls (DABs) may be used for example but the embodiments are not limited in this manner.

The interposer may be coupled to an upper portion of the package substrate.

The memory module and the memory controller (a CPU or a GPU) may be coupled to an upper portion of the interposer.

Physical areas PHY of the memory module and the memory controller (a CPU or a GPU) may be coupled to each other through the interposer.

The memory module may have a configuration including a plurality of dies that are stacked.

The plurality of dies may include the lowermost base die and a plurality of core dies stacked on the base die.

The base die and the plurality of core dies may be electrically connected or coupled to each other through a through electrode (for example, a TSV (Through Silicon Via)), and are configured such that data, commands, and addresses may be transmitted.

FIG. 1 illustrates only one memory module, and in an actual circuit configuration, a plurality of memory modules may be coupled to the memory controller (a CPU or a GPU) through the interposer.

A plurality of direct access balls (DABs) may be formed outside the package substrate.

The plurality of direct access balls (DABs) may be electrically connected or coupled to the memory module via the package substrate and the interposer.

The direct access balls (DABs) may be configured such that the memory module may be directly accessed from the exterior of the semiconductor system 100 for a test and/or other operations.

Figure 2:
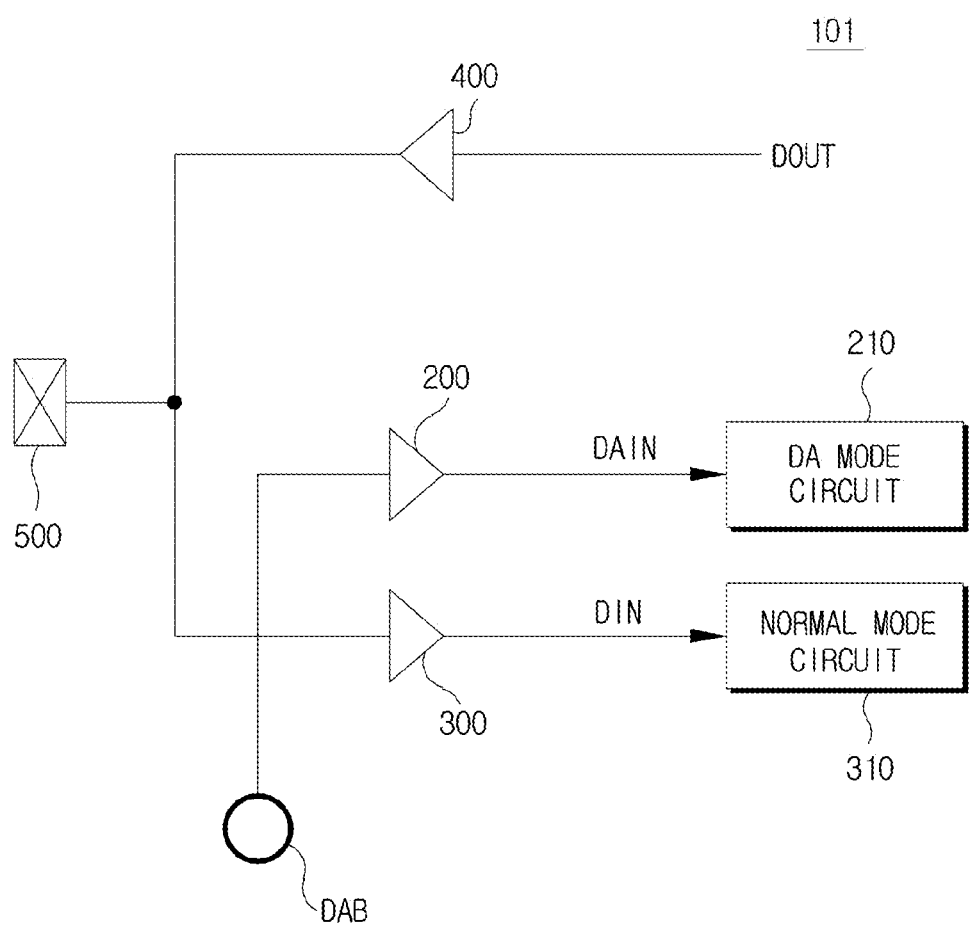
FIG. 2 is a diagram illustrating an example of a representation of a configuration of an input circuit 101 according to an embodiment.

Referring to FIG. 2, an input circuit 101 according to an embodiment may include a first input buffer 200 and a second input buffer 300.

The input circuit 101 according to an embodiment may further include a direct access mode circuit (hereinafter, referred to as a DA mode circuit) 210 and a normal mode circuit 310.

The first input buffer 200 may be configured to receive a signal through a direct access ball (DAB) and to output a first input signal DAIN.

The DA mode circuit 210 may be configured to perform an operation related to a DA mode according to the first input signal DAIN.

The second input buffer 300 may be configured to receive a signal through a normal input terminal 500 and to output a second input signal DIN.

The normal input terminal 500 may include a micro bump.

The normal input terminal 500 may not be exposed to the exterior of the package and may be formed within the package.

The normal input terminal 500 may be configured to receive data DOUT through an output buffer 400. The data DOUT may be outputted from the memory module. The normal input terminal 500 may be configured to output the data DOUT to the exterior of the memory module.

The normal mode circuit 310 may be configured to perform an operation (for example, data write and read operations and the like) related to a normal mode according to the second input signal DIN.

As described above, the direct access ball (DAB) may be electrically connected or coupled to the memory module via the package substrate and the interposer.

The input circuit 101 according to an embodiment may be configured in the memory module, for example, the base die.

In the input circuit 101 according to an embodiment, data inputted through the normal input terminal 500 from the exterior of the semiconductor system 100 or the memory controller (a CPU or a GPU) together with a write command, may be transferred to the normal mode circuit 310 through the second input buffer 300, so that a data read operation may be performed by the normal mode circuit 310.

Data, inputted from a test equipment through the direct access ball (DAB) in order to directly test the memory module, may be transferred to the DA mode circuit 210 through the first input buffer 200, so that a memory module test operation may be performed by the DA mode circuit 210.

In the aforementioned input circuit 101 according to an embodiment, one normal input terminal 500, one direct access ball (DAB), one first input buffer 200, and one second input buffer 300 may be configured for the purposes of convenience. However, the first input buffer 200 and the second input buffer 300 may be configured in proportion to the number of the normal input terminals 500 and the number of the direct access balls (DABs).

Figure 3:
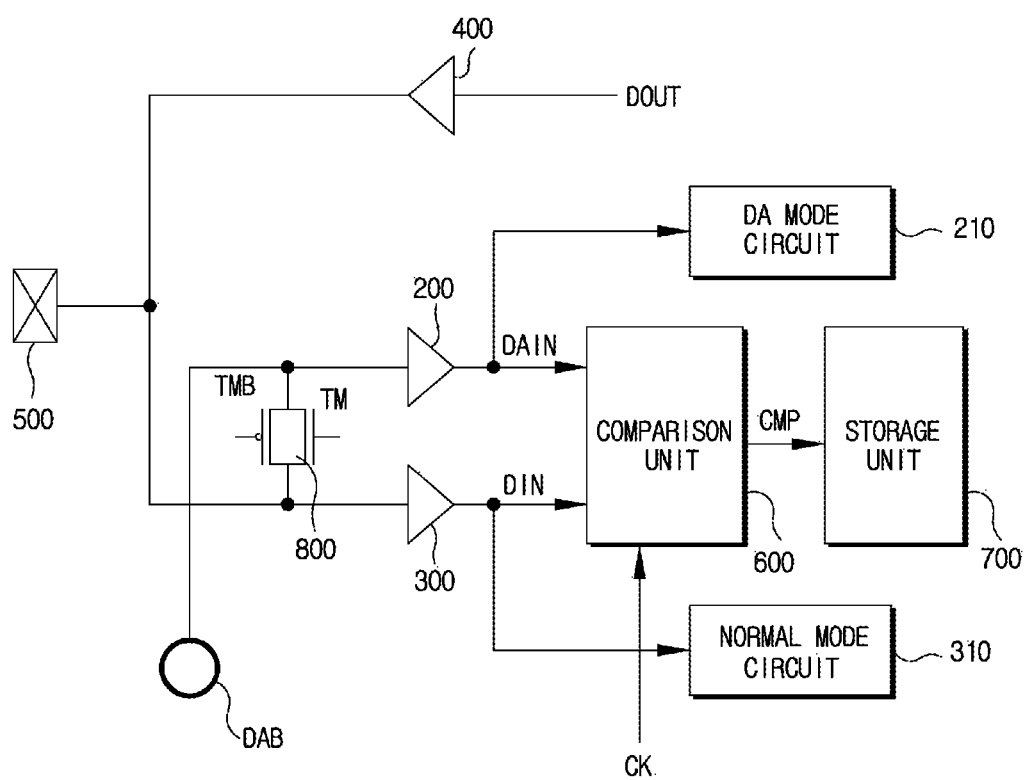
FIG. 3 is a diagram illustrating an example of a representation of a configuration of an input circuit 102 according to an embodiment.

Referring to FIG. 3, an input circuit 102 according to an embodiment may include the first input buffer 200, the second input buffer 300, and a switching unit 800. The input circuit 102 may include a comparison unit 600, and a storage unit 700.

The input circuit 102 according to an embodiment may further include the DA mode circuit 210 and the normal mode circuit 310.

The first input buffer 200 may be configured to receive a signal through the test input terminal. The test input terminal may include for example, the direct access ball (DAB). The first input buffer 200 may be configured to output the first input signal DAIN.

The DA mode circuit 210 may be configured to perform an operation related to the DA mode according to the first input signal DAIN.

The second input buffer 300 may be configured to receive a signal through the normal input terminal 500 and to output the second input signal DIN.

The normal input terminal 500 may include a micro bump.

The normal input terminal 500 may not be exposed to the exterior of the package and be formed in the package.

The normal input terminal 500 may be configured to receive data DOUT through an output buffer 400. The data DOUT may be outputted from the memory module. The normal input terminal 500 may be configured to output the data DOUT to the exterior of the memory module.

The normal mode circuit 310 may be configured to perform an operation (for example, data write and read operations and the like) related to the normal mode according to the second input signal DIN.

The switching unit 800 may be configured to transfer the signal inputted through the direct access ball (DAB) to the second input buffer 300 according to test mode signals TM/TMB.

The test mode signals TM and TMB may indicate differential signals and may have phases opposite to each other.

When the test mode signals TM/TMB are activated, that is for example, when the TM is logic high and the TMB is logic low, the switching unit 800 may transfer the signal inputted through the direct access ball (DAB) to the second input buffer 300.

The comparison unit 600 may be configured to compare the first input signal DAIN outputted from the first input buffer 200 with the second input signal DIN outputted from the second input buffer 300 according to a clock signal CK, and to generate a comparison signal CMP.

The comparison unit 600 may be configured to compare the first input signal DAIN outputted from the first input buffer 200 with the second input signal DIN outputted from the second input buffer 300 according to a clock signal CK, and to generate the comparison signal CMP.

The comparison unit 600 may include a XNOR logic gate or equivalent circuit and may perform a XNOR logic.

The comparison unit 600 may output the comparison signal CMP as logic high when the logic values of the first input signal DAIN and the second input signal DIN are equal or substantially equal to each other, and output the comparison signal CMP as logic low when the logic values of the first input signal DAIN and the second input signal DIN are different from each other.

The storage unit 700 may be configured to store the comparison signal CMP.

The storage unit 700 may include a register accessible from the exterior of the semiconductor system 100.

As the storage unit 700, a register for storing a test result of a boundary scan test circuit may be used.

As described above, the direct access ball (DAB) may be electrically connected to the memory module via the package substrate and the interposer.

The input circuit 102 according to an embodiment may be configured in the memory module, for example, the base die.

In the aforementioned input circuit 102 according to an embodiment, one normal input terminal 500, one direct access ball (DAB), one first input buffer 200, and one second input buffer 300 may be configured for the purposes of convenience. However, the first input buffer 200, the second input buffer 300, and the switching unit 800 may be configured in proportion to the number of the normal input terminals 500 and the number of the direct access balls (DABs).

The comparison unit 600 may include XNOR logics proportional to the number of the normal input terminals 500 and the number of the direct access balls (DABs), and the storage unit 700 may also include a plurality of registers.

Figure 4:
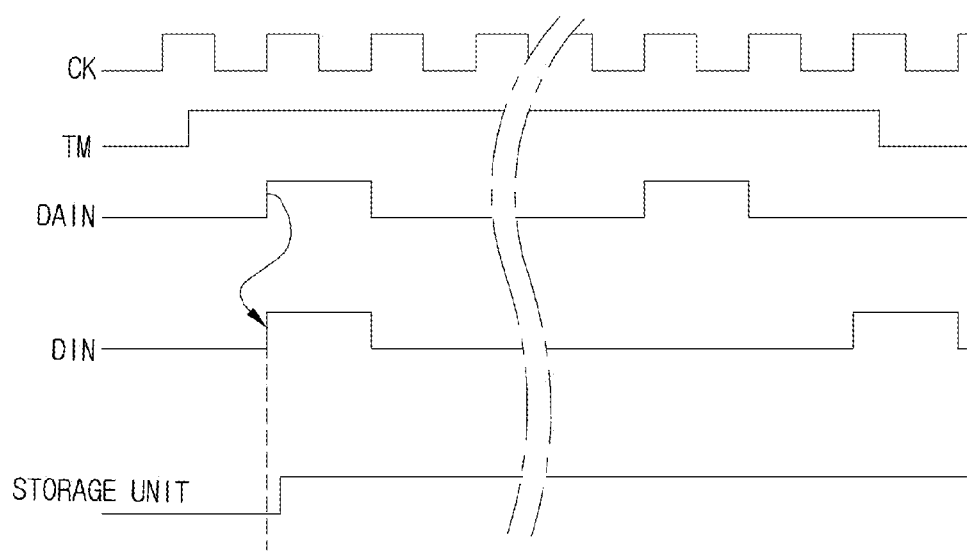
FIG. 4 is a timing diagram illustrating an example of a representation of an operation of an input circuit 102 of FIG. 3.

With reference to FIG. 4, the operation of the input circuit 102 according to an embodiment will be described.

As described above, the normal input terminal 500 may have a micro bump structure, and may not be directly accessed through test equipment located outside the semiconductor system 100.

In this regard, in an embodiment, the operation of the input circuit 102 may be tested using the direct access ball (DAB), and an operation thereof will be described below.

The semiconductor system 100 enters a test mode and tests data, for example, logic high data is inputted through the direct access ball (DAB).

As the semiconductor system 100 enters the test mode, the test mode signal TM has, for example, a logic high value.

At this time, the TMB has, for example, a logic low value.

Since the test mode signal TM is logic high, the data inputted through the direct access ball (DAB) is simultaneously inputted to the first input buffer 200 and the second input buffer 300.

When the first input buffer 200 and the second input buffer 300 are normally operating, they simultaneously output the first input signal DAIN of logic high and the second input signal DIN of logic high.

Since the logic values of the first input signal DAIN and the second input signal DIN are substantially equal to each other, the comparison unit 600 outputs the comparison signal CMP of logic high.

The comparison signal CMP of logic high may be stored in the storage unit 700.

It is possible to test whether the second input buffer 300 is normally operating by reading a value stored in the storage unit 700.

When a logic high value has been stored in the storage unit 700, the second input buffer 300 may be determined to normally operate.

However, when the second input buffer 300 is not normally operating, since the logic values of the first input signal DAIN and the second input signal DIN are different from each other, the comparison unit 600 outputs the comparison signal CMP of logic low.

Therefore, since a logic low value is stored in the storage unit 700, the second input buffer 300 may be determined to not be normally operating.

When the test mode is ended and the semiconductor system 100 enters the normal mode, the test mode signal TM has a logic low value.

At this time, the TMB has a logic high value.

Since the test mode signal TM is logic low, the data inputted through the direct access ball (DAB) is inputted only to the first input buffer 200.

The first input buffer 200 outputs the first input signal DAIN of logic high.

Since the test mode signal TM is logic low, data inputted through the normal input terminal 500 is inputted only to the second input buffer 300.

The second input buffer 300 outputs the second input signal DIN of logic high.

A value stored in the storage unit 700 may be substantially maintained to a recent test value.

Figure 5:
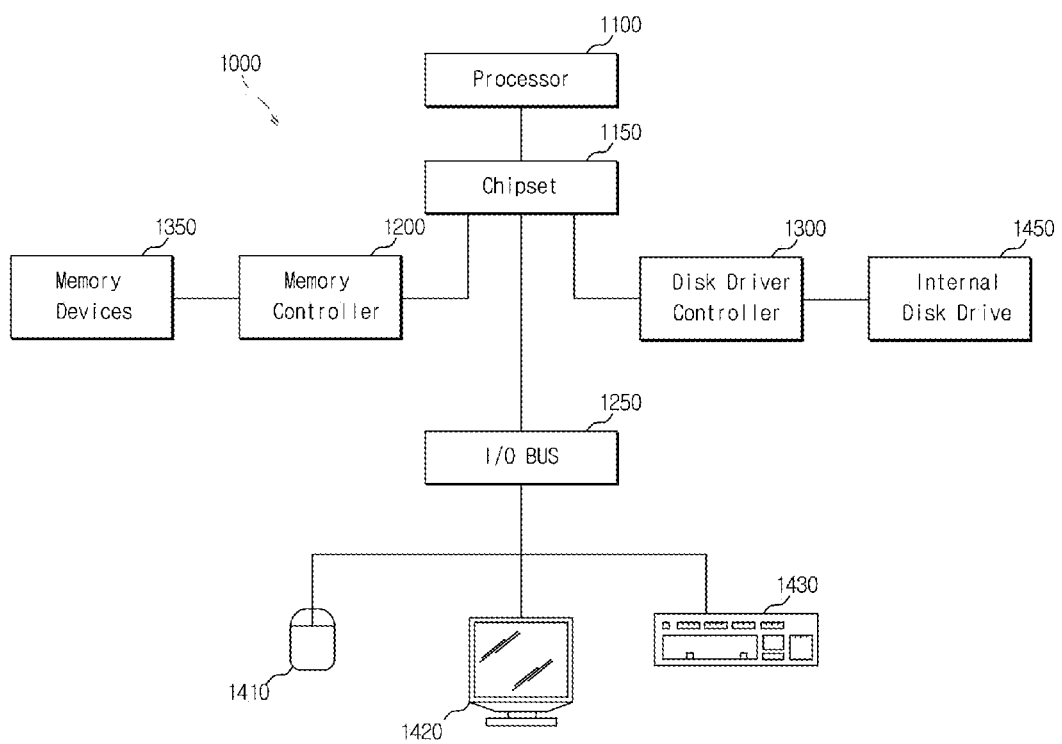
FIG. 5 illustrates a block diagram of an example of a representation of a system employing the input circuit of a semiconductor apparatus and/or semiconductor system in accordance with the embodiments discussed above with relation to FIGS. 1-4.

The input circuit of a semiconductor apparatus and/or semiconductor system discussed above (see FIGS. 1-4) are particular useful in the design of memory devices, processors, and computer systems. For example, referring to FIG. 5, a block diagram of a system employing the input circuit of a semiconductor apparatus and/or semiconductor system in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one input circuit of a semiconductor apparatus and/or semiconductor system as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one input circuit of a semiconductor apparatus and/or semiconductor system as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the input circuit of a semiconductor apparatus and/or semiconductor system as discussed above with relation to FIGS. 1-4. In alternate embodiments, such as cellular phones or digital cameras, the components may differ from the embodiments illustrated in FIG. 5.

While various embodiments have been described above, it will be understood to those skilled in the art that the embodiments described are by way of example only. Accordingly, the input circuit of a semiconductor apparatus and the semiconductor system using the same described herein should not be limited based on the described embodiments. Rather, the input circuit of a semiconductor apparatus and the semiconductor system using the same described herein should only be limited in light of the claims that follow when taken in conjunction with the above description and accompanying drawings.

What is claimed is:

1. An input circuit of a semiconductor apparatus, comprising:

a first input buffer configured to receive a first signal through a test input terminal and to output a first input signal;

a second input buffer configured to receive a second signal through a normal input terminal and to output a second input signal;

a switching unit configured to transfer the first signal inputted through the test input terminal to the second input buffer according to a test mode signal;

a comparison unit configured to compare the first input signal with the second input signal and to generate a comparison signal; and a storage unit configured to store the comparison signal, wherein, the semiconductor apparatus includes a semiconductor memory module and a memory controller, and wherein the test input terminal includes a direct access ball (DAB) exposed to an exterior of the semiconductor apparatus to access the memory module directly, wherein a direct access mode circuit is configured to perform an operation related to a direct access mode according to the first input signal, and wherein a data, inputted from a test equipment through the DAB in order to directly test the memory module, is transferred to the direct access mode circuit through the first input buffer, so that a memory module test operation is performed by the direct access mode circuit.

2. The input circuit of a semiconductor apparatus according to claim 1, wherein the normal input terminal includes a micro bump located within the semiconductor apparatus.

3. The input circuit of a semiconductor apparatus according to claim 1, further comprising:

a normal mode circuit configured to perform an operation including data write or read related to a normal mode according to the second input signal.

4. The input circuit of a semiconductor apparatus according to claim 1, wherein the comparison unit is configured to perform a XNOR logic.

5. The input circuit of a semiconductor apparatus according to claim 1, wherein the comparison unit compares the first input signal with the second input signal and to generate the comparison signal according to a clock signal.

6. The input circuit of a semiconductor apparatus according to claim 1, wherein the storage unit includes a register accessible from an exterior of the semiconductor apparatus.

* * * * *